United States Patent
Zelner et al.

(10) Patent No.: US 11,444,150 B2
(45) Date of Patent: Sep. 13, 2022

(54) METHOD AND APPARATUS FOR A THIN FILM DIELECTRIC STACK

(71) Applicant: NXP USA, Inc., Austin, TX (US)

(72) Inventors: Marina Zelner, Burlington (CA); Andrew Vladimir Claude Cervin, Oakville (CA); Edward Provo Wallis Horne, Burlington (CA)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/118,916

(22) Filed: Dec. 11, 2020

(65) Prior Publication Data
US 2021/0104596 A1    Apr. 8, 2021

Related U.S. Application Data

(62) Division of application No. 15/901,498, filed on Feb. 21, 2018, now Pat. No. 10,896,950.

(60) Provisional application No. 62/464,168, filed on Feb. 27, 2017.

(51) Int. Cl.
*H01L 49/02*    (2006.01)
*H01L 21/02*    (2006.01)

(52) U.S. Cl.
CPC .......... *H01L 28/40* (2013.01); *H01L 21/0228* (2013.01); *H01L 21/02183* (2013.01); *H01L 21/02186* (2013.01); *H01L 21/02197* (2013.01); *H01L 21/02266* (2013.01); *H01L 21/02282* (2013.01); *H01L 21/02304* (2013.01); *H01L 21/02356* (2013.01); *H01L 28/56* (2013.01); *H01L 28/75* (2013.01); *H01L 28/65* (2013.01)

(58) Field of Classification Search
CPC .............. H01L 28/40; H01L 21/02183; H01L 21/02186; H01L 21/02197; H01L 21/02266; H01L 21/0228; H01L 21/02282; H01L 21/02304; H01L 21/02356; H01L 28/56; H01L 28/75; H01L 28/65
See application file for complete search history.

(56) References Cited

U.S. PATENT DOCUMENTS

| | | | |
|---|---|---|---|
| 5,976,927 A * | 11/1999 | Hsieh | H01L 21/76202 |
| | | | 257/E21.552 |
| 2002/0075736 A1 | 6/2002 | Kumura et al. | |
| 2016/0268048 A1* | 9/2016 | Zelner | H01L 28/56 |

FOREIGN PATENT DOCUMENTS

JP    07273297    * 10/1995    ............. H01L 27/10

* cited by examiner

*Primary Examiner* — Julia Slutsker

(57) ABSTRACT

A system that incorporates teachings of the subject disclosure may include, for example, a thin film capacitor a silicon substrate having a silicon dioxide layer; an adhesion layer on the silicon dioxide layer, wherein the adhesion layer is a polar dielectric; a first electrode layer on the adhesion layer; a dielectric layer on the first electrode layer; and a second electrode layer on the dielectric layer. Other embodiments are disclosed.

18 Claims, 8 Drawing Sheets

METHOD AND APPARATUS FOR A THIN FILM DIELECTRIC STACK

CROSS-REFERENCE TO RELATED APPLICATIONS

This application is a divisional of co-pending, U.S. patent application Ser. No. 15/901,498, filed Feb. 21, 2018, which claims the benefit of U.S. Provisional Application No. 62/464,168, filed Feb. 27, 2017, the disclosure of which is hereby incorporated by reference herein.

FIELD OF THE DISCLOSURE

This present invention relates, in general, to a thin film dielectric stack, and more particularly, to systems of and methods for manufacturing a thin film multilayer tunable dielectric stack.

BACKGROUND

Ferroelectric capacitors have various uses in RF systems including as voltage-tunable devices. Some benefits of ferroelectric capacitors are small size, integration of different values and functions of capacitance, and low cost. Applications for ferroelectric capacitors may include tunable filters, voltage controlled oscillators, tunable phase shifters, tunable matching networks, low-impedance power supplies, decoupling high-frequency signals at an IC bonding pad, or others.

Integrated circuits including ferroelectric capacitors may, for example, be used in portable electronics for low-power wireless communication (e.g., cellular phones, pagers, PDAs, and so forth), directional antenna systems, high clock-rate microphones, miniature DC to DC converters, or other devices.

Current techniques of depositing high-K tunable dielectric materials can have limited throughput and thus high capital and manufacturing costs. Current techniques can also have limitations in flexibility of composition that may not allow the best optimization or improvement of RF and DC properties of the dielectric stack.

BRIEF DESCRIPTION OF THE DRAWINGS

Reference will now be made to the accompanying drawings, which are not necessarily drawn to scale, and wherein.

DETAILED DESCRIPTION

Figure 1:
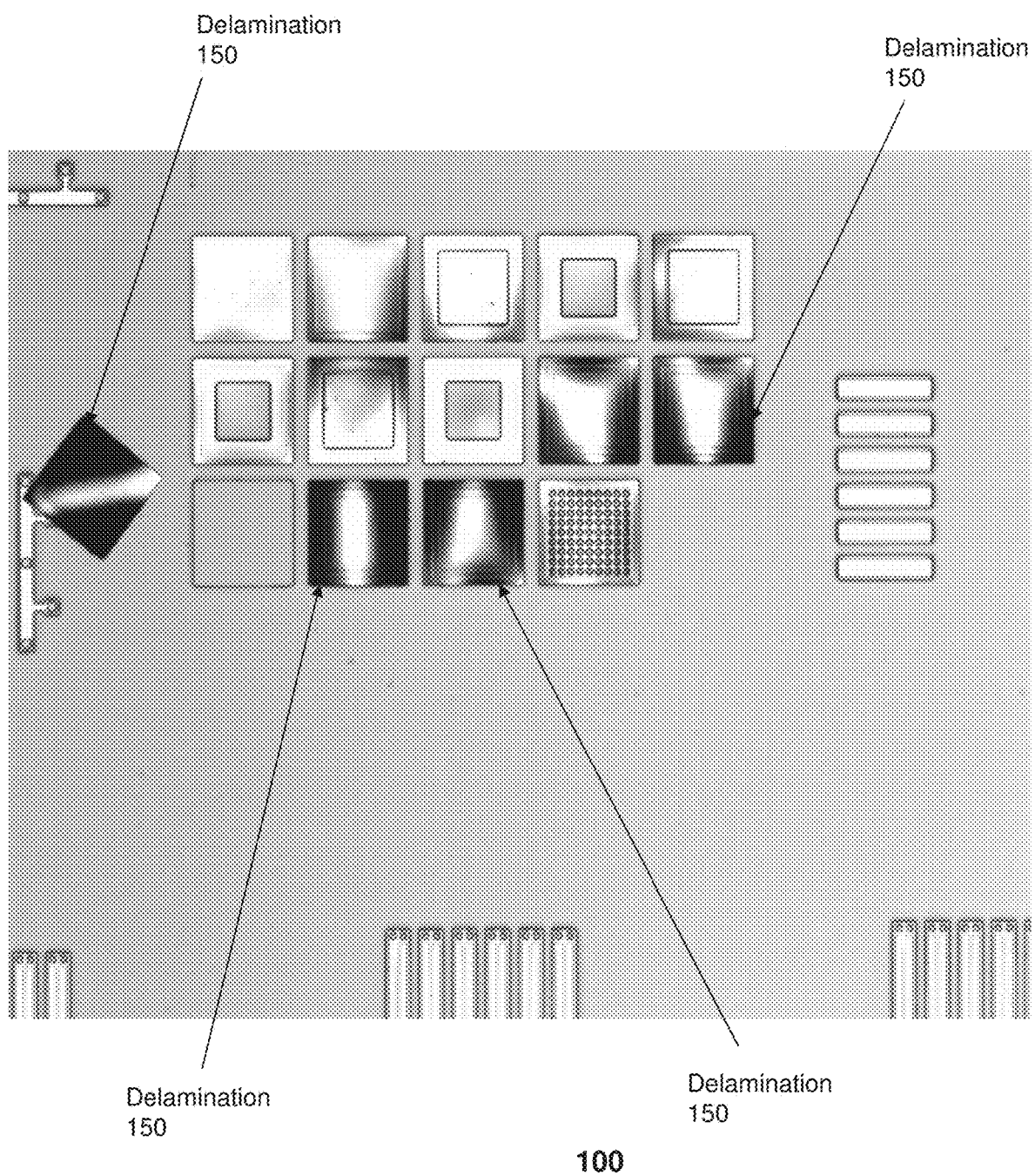
FIG. 1 illustrates an integrated circuit illustrating delamination.

The subject disclosure describes, among other things, illustrative embodiments of a thin film capacitor and a method of fabricating a thin film capacitor, such as with an adhesion layer(s). The adhesion layer can be or otherwise include a polar dielectric material provided on an oxide layer of a substrate to provide better adhesion between an electrode layer and the oxide layer. In one or more embodiments, the use of the particular adhesion layer(s) can enable silicon substrates to be utilized and can facilitate the electrode layer adhering to the substrate. In one or more embodiments, the polar dielectric can be selected from the family of alkali or alkali earth titanate, zirconate, niobate, silicate, and tantalite or the mixture thereof.

Examples of the capacitor can include single dielectric layer and multiple dielectric layer capacitors. The components and techniques described in U.S. application Ser. No. 14/642,222 filed Mar. 9, 2015 and U.S. application Ser. No. 15/184,081 filed Jun. 16, 2016 are hereby incorporated by reference herein in their entirety. These applications describe configurations and fabrication techniques, including particular deposition processes and parameters of those processes, that can be used with one or more of the exemplary embodiments described herein, including in addition to components or steps of the exemplary embodiments or in place of components or steps of the exemplary embodiments.

Fabrication of tunable thin film capacitors with high-K dielectrics utilizes high processing temperatures for the deposition of the dielectric and/or post-deposition anneals. Most of these anneals are done in oxygen. The electrodes can be of uniform composition or have multiple layers comprised of conductive, semiconductive or resistive materials. The electrode materials can be chosen from metals, electrically conductive compounds, or multilayer compositions thereof, such as pure Pt, Ir, Ru, Os, Au metal alloys, conductive or resistive oxides, and can include metal diffusion barriers, hillock suppressors, shunt conductors and composites. Conductive compounds like TiN, SiCr, ITO (Indium Tin Oxide), SRO (Strontium Ruthenium Oxide), etc. also can be used as all or part of the electrodes.

Tunable capacitors have been built on Sapphire, Silicon-on-Sapphire (SOC), Alumina Ceramic, and MgO (references) substrates. Different versions of $SiO_2$ can be used for smoothing out the surface of the wafers and/or for reduction of the influence of the substrate crystalline orientation. These materials have Thermal Expansion Coefficients (TEC) well matched with those of electrode materials and high-K dielectrics (e.g., 6-9 ppm). However, the main disadvantages of Sapphire, Alumina Ceramic, Silicon-on-Sapphire (SOC), and MgO (references) substrates are high substrate cost, scale up limitation, and high cost of dicing/thinning. These disadvantages can be limiting to commercialization of tunable capacitors based on high-K dielectrics.

Silicon substrates are a very attractive low cost substrate. The main technical difficulty implementing Si substrates for tunable capacitor application can be the low TEC of Si (3.5 ppm). Different versions of $SiO_2$ (e.g., LTO, PSG, and so forth) can be used for smoothing out the surface of the wafers and/or for reduction of the influence of the substrate crystalline orientation. Electrode materials are noble metals or conductive compounds. None of the electrode materials may self-adhere to $SiO_2$ Adhesion layers can be utilized to maintain the integrity of the capacitor stack on the wafer through the integrated front-end and back-end processing to the full passivation.

Thin film Ti, Ta, TiOx and TaOx are other adhesion layers that can be used on Sapphire, Silicon-on-Sapphire (SOC), Alumina Ceramic, and MgO substrates. However, the adhesion strength between $SiO_2$ and these other adhesion layers on Si substrates can be insufficient for withstanding the stress on silicon substrates resulting from much higher TEC mismatch compared to $Al_2O_3$ or MgO based substrates.

In one or more embodiments, an efficient adhesion layer is utilized for fabrication of tunable capacitors on Si substrates using high-K dielectrics. One or more of the exemplary embodiments can utilize a single-layer or multi-layer (e.g., double) adhesion layer for a silicon substrate, such as where the first layer is a low temperature deposited oxide layer of a polar dielectric, (e.g., barium-strontium-titanate (BST)). The polar dielectric layer provides strong adhesion strength to $SiO_2$. In one or more embodiments, a second or subsequent layer(s) can be utilized over the polar dielectric adhesion layer where the second or subsequent layer(s) are other types of adhesion layers, including thin film Ti, Ta, TiOx and TaOx.

The polar dielectric adhesion layer can be used by itself or in combination with one of the Ti, Ta, TiOx and TaOx adhesion layers to ensure the integrity of the multi-layer capacitor stack above it and to improve the surface texture of the underlying oxide surface. The exemplary embodiments can give significant cost reduction for tunable capacitors by allowing the use of lower cost silicon substrates and reducing the attendant dicing and thinning costs while maintaining the integrity of the structure through adhesion.

One embodiment of the subject disclosure is a method for fabricating a thin film capacitor. The method can include depositing an adhesion layer on a silicon dioxide layer of a silicon substrate, where the adhesion layer comprises a polar dielectric, and wherein the adhesion layer is not any thin film of Ti, Ta, TiOx and TaOx. The method can further include depositing a first electrode layer on the adhesion layer, depositing a dielectric layer on the first electrode layer, and depositing a second electrode layer on the dielectric layer.

One embodiment of the subject disclosure is a thin film capacitor that has a silicon substrate with a silicon dioxide layer. The capacitor can have an adhesion layer on the silicon dioxide layer, where the adhesion layer is a polar dielectric. A first electrode layer can be deposited on the adhesion layer. A dielectric layer can be deposited on the first electrode layer. The second electrode layer can be deposited on the dielectric layer.

One embodiment of the subject disclosure is a method for fabricating a thin film capacitor. The method can include depositing a first adhesion layer on a silicon dioxide layer of a silicon substrate, where the adhesion layer comprises a polar dielectric. The method can further include depositing a second adhesion layer on the first adhesion layer and depositing a first electrode layer on the second adhesion layer. The method can further include depositing a dielectric layer on the first electrode layer and depositing a second electrode layer on the dielectric layer.

In one or more embodiments, the adhesive strength can be dependent on the chemical affinity of the adhesion layer to the initial oxide ($SiO_2$) and to the electrode material. The electrode materials can be chosen from metals, electrically conductive compounds, or multilayer compositions thereof. To adhere to $SiO_2$ chemically, the material of adhesion layer can be selected with one or more of the following properties:

(1) reacts with $SiO_2$ creating Me-O—Si bonds of higher polarity than the polarity of Si—O bonds;
(2) has a low mismatch in thermal expansion coefficient with the electrode material since there is mostly chem-phys, rather than chemical bonding in case of electrodes made of noble metals;
(3) should not create intermetallic compounds reacting with the electrode materials since that will result in defects in the electrodes; and
(4) provides smooth and uniform interface for the electrode deposition.

Conventional adhesion layer materials can include:
Metals: Ti, Ta (disadvantages: limited adhesion strength at $SiO_2$ interface due to low reactivity, the result of polarity Ta—O—Si and Ti—O—Si bonds. Another disadvantage can be the intermetallic formation).
Oxides: $TiO_2$, $Ta_2O_5$ (the same disadvantage described above but better for intermetallics); they can provide a smooth interface, no intermetallics;
Compounds: TiN (the same disadvantage as described above and additionally poor thermal stability).

Polar dielectric adhesion layers have a number of advantages. Polar dielectrics, such as alkali metal titanates and alkali-earth metal titanates, are more reactive with $SiO_2$ (initial oxide). Polar dielectrics have more polar bonding with lower energy of dissociation as compared to the materials described above for conventional adhesion layers. This results in more easily creating strong —Ti—O-Me-O—Si— chemical bonds. The alkali titanates/tantalates can be very reactive with $SiO_2$ but they can also create intermetallics with the electrode material. In that situation, a double layer adhesion layer (e.g., a polar dielectric adhesion layer followed by a conventional adhesion layer) can provide strong adhesion. More polar titanates and tantalates are also having higher thermal expansion coefficients than less polar oxides and lower thermal mismatch with electrode materials as a result of that.

In one or more embodiments, the adhesion layer(s) can be poly-crystalline or amorphous. In another embodiment, the adhesion layer(s) can have a smooth, uniform structure. In one or more embodiments, the deposition technique can result in a continuous thin uniform layer. PVD (e.g., sputtering or PLD) can be a preferred deposition technique since the resulting film has high physical density, which can reduce minimum thickness.

In one or more embodiments, the thickness of the adhesion layer or the multiple adhesion layers can be about 50 A to 500 A thick. In one or more embodiments, the deposition and/or anneal temperature can be selected based on the materials involved. For example, the higher the bond polarity (and reactivity)—the lower the temperature required for Me-O—Si bond formation. Alkali earth titanates can adhere well at room temperature, while BST can require a temperature of about 200 C and up. The higher the temperature that is used—can result in the rougher the grain.

Referring to FIG. 1, an image of a thin film capacitor 100 is shown that has a TiOx adhesion layer on a silicon dioxide layer of a silicon substrate. The thin film capacitor 100 has a multi-layer dielectric BST. Etching has been performed resulting in the $SiO_2$ being visible in the image. The TiOx adhesion layer is between a bottom electrode and the $SiO_2$ layer of the Si substrate.

The dark regions 150 of the thin film capacitor 100 indicate delamination of the thin film components, such as the bottom electrode layer failing to adhere (e.g., along its edges) to the adhesion layer resulting in curling up or otherwise being delaminated.

Figure 2:
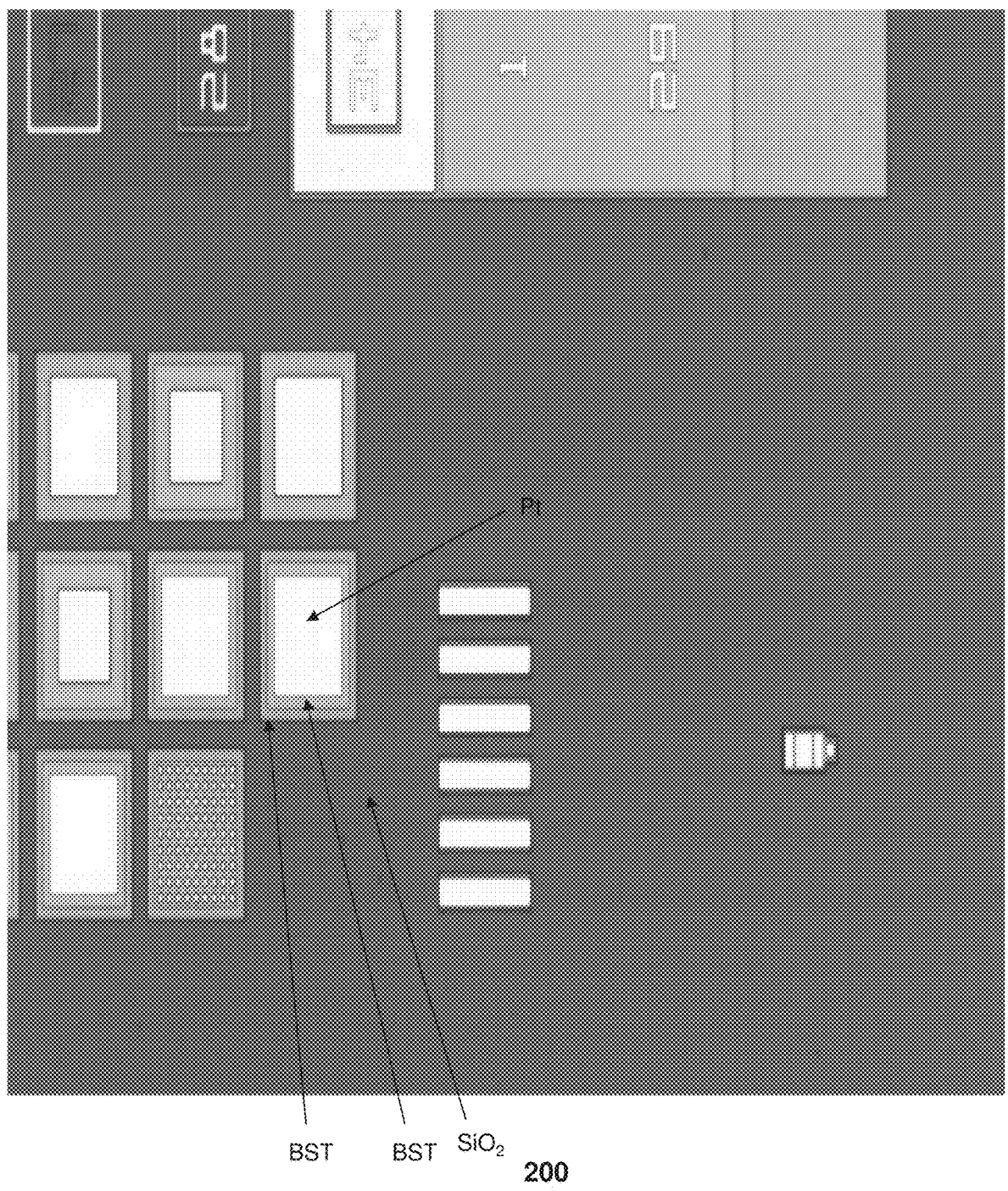
FIG. 2 illustrates an exemplary embodiment of a thin film capacitor having a polar dielectric adhesion layer.

Referring to FIG. 2, an image of a thin film capacitor 200 is shown that is fabricated utilizing a double adhesion layer on a silicon dioxide layer of a silicon substrate. Thin film capacitor 200 indicates no delamination on a similar part of the wafer as in FIG. 1.

The thin film capacitor has a multi-layer dielectric BST. Etching has been performed resulting in the $SiO_2$ being visible in the image. The BST adhesion layer (i.e., polar dielectric adhesion layer) is deposited on the $SiO_2$ layer and the TiOx adhesion layer is deposited on the BST adhesion layer. The double adhesion layer is between a bottom electrode and the $SiO_2$ layer of the Si substrate.

In one embodiment, polar dielectrics are those in which the possibility of center coinciding of the positive as well as negative charge is almost zero. Polar dielectrics can have an asymmetric shape. In one embodiment, non-polar dielectrics are those in which the centers of both positive as well as negative charges coincide. The dipole moment of each molecule in a non-polar can be zero and can be symmetric in shape.

The use of polar dielectric adhesion layers on the $SiO_2$ of a Si substrate can be utilized with various configurations of capacitors, including single layer dielectric capacitors and multi-layer dielectric capacitors.

Figure 3:
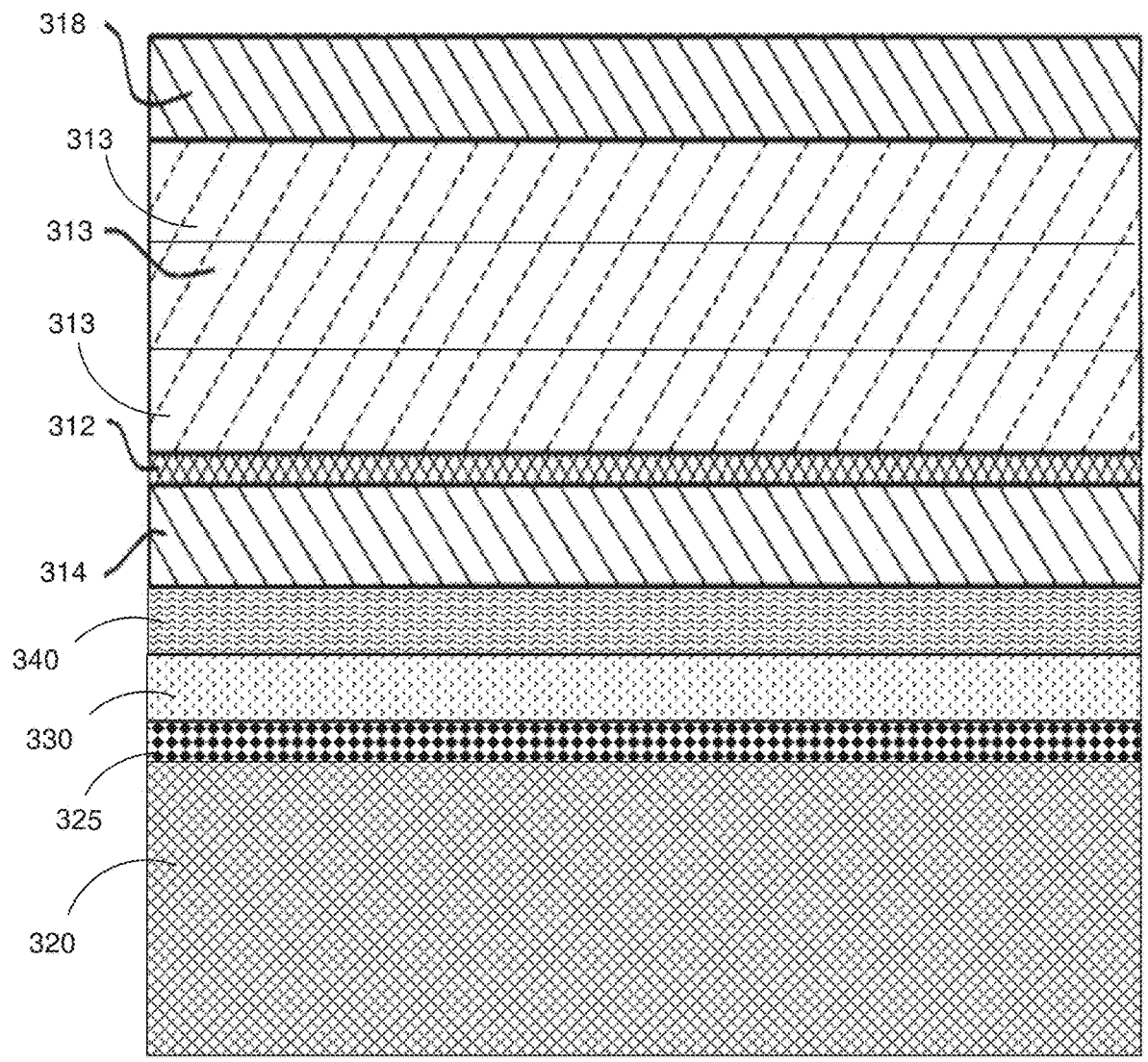
FIG. 3 illustrates an exemplary embodiment of a thin film capacitor having multiple dielectric layers.

Referring to FIG. 3, a ferroelectric capacitor 300 is illustrated that utilizes a polar dielectric adhesion layer and can also improve time-dependent dielectric breakdown. In one or more embodiments, capacitor 300 can reduce or eliminate dendrite formation, and/or reduce or eliminate hillock formation along electrodes.

In one or more embodiments, electrodes 314, 318 can be utilized which are formed of various materials including platinum, platinum alloy, iridium either solely or in combination with iridium oxide, ruthenium oxide, or Strontium Ruthenium Oxide (SRO), any metal or conductive oxide or any combination of these materials. The electrodes 314, 318 can be formed from other conductive materials, including non-metal conductive materials. The electrodes 314, 318 can be formed from the same material or can be formed from different materials. In one or more embodiments, the electrodes 314, 318 can be a conductive layer comprised of metals, conductive oxides or a combination thereof while the dielectric layer is comprised of a high K dielectric material.

In one or more embodiments, the capacitor structure 100 with multiple dielectric layers 312, 313 can be formed on a substrate 320, which can be a silicon substrate. The substrate 320 can include a silicon dioxide layer 325. A first adhesion layer 330 can be deposited on the silicon dioxide layer 325. The first adhesion layer 330 can be or otherwise can include a polar dielectric, such as BST, although other polar dielectric materials can be selected depending on the materials, fabrication techniques and performance parameters of the capacitor 300. In one embodiment a second (or more) adhesion layer(s) 340 can be deposited on the first adhesion layer 330. As an example, the second adhesion layer can be a thin film of Ti, Ta, TiOx and TaOx. Other layers can also be included in the capacitor 300 such as a hermetic insulating layer ($Si_3N_4$).

Capacitor 300 can include the first dielectric layer 312, and one or more second dielectric layers 313 (three of which are shown). In one or more embodiments, the dielectric layers 312 and 313 can be formed directly on each other. The dielectric layers 312, 313 can be formed between the electrode layer 314 and the electrode layer 318.

In one or more embodiments, the first dielectric layer 312 can be formed of BST. In other embodiments, the first dielectric layer 312 can be formed of other materials, such as Strontium Bismuth Tantalate (SBT), Lead Zirconate Titanate (PZT), Lead Lanthanum Zirconate Titanate (PLZT), any other perovskite or pyrochlore phase ferroelectric film, or a combination thereof.

In one or more embodiments, the first dielectric layer 312 can be formed by a process and/or formed from material(s) that enable the first dielectric layer to suppress formation of hillocks at the electrode-dielectric interface between layers 312 and 314. The first dielectric layer 312 can be formed by a process and/or formed from material(s) that provide for a particular grain habit in the first dielectric layer, such as vertically-oriented columnar grain structure. For example, the first dielectric layer 312 can be formed as a thin high density dielectric buffer layer using a sputter-deposition technique at a particular temperature. In one or more embodiments, the sputter deposit of first dielectric layer 312 can be performed at a temperature of at least 20 degrees Celsius lower than the stress relief temperature of the electrode 314. In one or more embodiments, the first dielectric layer 312 can have a thickness between 50 and 500 Angstroms (Å).

In one or more embodiments, the second dielectric layers 313 can be a group of stacked dielectric layers that are formed from the same material or that are formed (in whole or in part) from different materials. As an example, the second dielectric layers 313 can be a tunable high-K dielectric with randomly oriented grains deposited on the first dielectric layer 312 using techniques such as MOD or sol-gel deposition. For instance, spin-deposition or misted deposition can be utilized for depositing the second dielectric layers 313. However, other deposition techniques may also be used, where they allow for the randomly oriented grain structure of the second dielectric layers 313.

In one or more embodiments, the composition of the second dielectric layers 313 can be the same or different than the composition of the first dielectric layer 312. For example, the materials utilized for the second dielectric layers 313 can be selected to improve or optimize RF and DC properties of the resulting device. For instance, materials can be selected for the second dielectric layers 313 to improve or optimize one or more of material losses, capacitance-voltage (CV) response or curve, maximum capacitance tuning ratio, reliability and electrostrictive resonance cancellation.

In one or more embodiments, densification of the second dielectric layer 313 can be performed by annealing in $O_2$ or an $O_2$/Carrier gas mixture at a temperature higher than the deposition temperature of the first dielectric layer 312 but lower than a final crystallization temperature of the capacitor stack as will be described later. The deposition and anneal of the group of second dielectric layers 313 of tunable high-K dielectric can be repeated until the desired dielectric stack thickness is achieved.

In one or more embodiments, the composition of each layer of the group of dielectric layers 313 can be the same or can be different from one or more other layers of the group of dielectric layers 313 in order to achieve improved or optimal RF and DC properties. In one embodiment, the different compositions can be deposited on a single spin track by having multiple dispense pumps for the solution. After the annealing, the resulting dielectric stack can be amorphous and about 70% densified. Final density can be achieved after a final crystallization of the dielectric/electrode stack.

In one or more embodiments, one or more of the group of second dielectric layers 313 can be formed from various materials including BST, SBT, PZT, PLZT, any other perovskite or pyrochlore phase ferroelectric film, or a combination thereof. In one or more embodiments, the group of second dielectric layers 313 can be formed by a process and/or formed from material(s) that suppress dendrite formation and/or distort the orientation of crystalline columnarity of the first dielectric layer 312 while providing an interruption in vertically oriented grain boundaries of the capacitor resulting in an improvement in the time-dependent dielectric breakdown behavior of the capacitor. In one or more embodiments, one or more of the group of second dielectric layers 313 can be formed by a process and/or formed from material(s) that provide for a randomly-oriented grain structure in the particular layer.

In one embodiment, the first and second dielectric layers 312, 313 can utilize a combination of an undoped BST and a doped BST formulation, or a combination of different ferroelectric materials to facilitate reducing space charge effects and/or improving a temperature dependence of the dielectric properties of the capacitor 300. In another embodiment, different layers of the group of second dielectric layers 313 can use doped and undoped BST materials.

In one embodiment, the thickness of the first dielectric layer 312 and/or the second dielectric layer(s) 313 can be selected so that they are thin enough to not adversely affect the operation of the capacitor 300 but thick enough to enable suppression of hillock formation, suppression of dendrite formation, and/or avoid or reduce charge trapping at the electrode-dielectric interface. As an example, the overall thickness of the combination of the first and second dielectric layer(s) 312, 313 can be less than 300 A or less than 800 A. In one embodiment, the thickness of the first dielectric layer 312 can be different from the thickness of one, some or all of the second dielectric layers 313. The thicknesses selected for the first dielectric layer 312 and/or second dielectric layer(s) can be based on various factors including one or more of the dielectric material(s) being utilized, the electrode material(s) being utilized, the desired properties of the capacitor, the desired size and/or shape of the capacitor, the operating environment of the capacitor, and so forth.

In one embodiment, the first adhesion layer 330 and the first and/or second dielectric layers 312, 313 can be formed of the same material. In another embodiment, the first adhesion layer 330 and the first and/or second dielectric layers 312, 313 can be formed of different materials.

Figure 4:
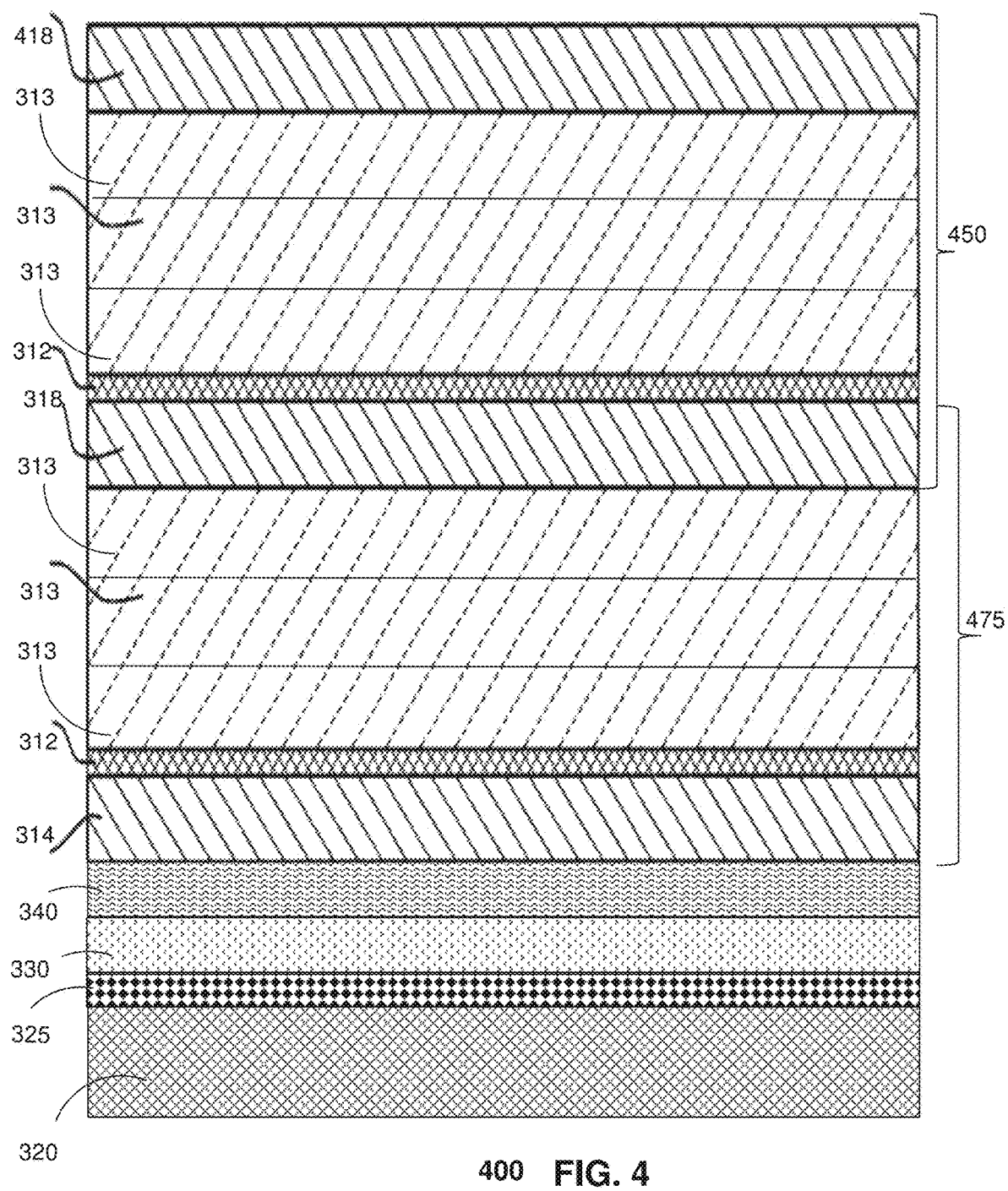
FIG. 4 illustrates another exemplary embodiment of a thin film capacitor having multiple dielectric layers.

Referring to FIG. 4, a ferroelectric capacitor 400 is illustrated that includes first dielectric layers 312, and groups of second dielectric layers 313 (in this example each group including three second dielectric layers), and which includes a polar dielectric adhesion layer. The dielectric layers 312, 313 as described above can be formed by a process, formed from material(s) and/or have particular crystal grain structures which provide desired properties to the capacitor 400, such as suppression of dendrite formation, suppression of hillock formation and/or improvement of time-dependent dielectric breakdown. Capacitor 400 illustrates first and second capacitors 450, 475 that are stacked together sharing a middle electrode 318 and further having a top electrode 418. The first capacitor 475 including bottom electrode 314 utilizes or is otherwise deposited on the first adhesion layer 330 (e.g., a polar dielectric layer) and the second adhesion layer (e.g., a thin film of Ti, Ta, TiOx or TaOx).

Capacitor 400 can have any number of stacked capacitors that are each formed from the dielectric layers 312, 313. Any number of sets of stacked dielectric layers 312, 313 can be utilized and various other connections can be implemented (not shown). In one embodiment, the sets of dielectric layers that each form capacitors 450, 475 can be the same or similar (e.g., having the same number of layers where corresponding layers in different sets have the same thickness, materials, and/or grain structure). In another embodiment, the sets of dielectric layers can have the same number of layers but corresponding layers in different sets can have the same or different thickness, materials, and/or grain structure). As an example, different capacitors stacked together may have different desired properties so that the thicknesses and/or materials forming the corresponding layers in different sets can be different. In another embodiment, the sets of dielectric layers can have different numbers of layers, such as a bottom capacitor having three second dielectric layers 313, a middle capacitor having five second dielectric layers 313, and a top capacitor having a single second dielectric layer 313.

In one embodiment, the fabrication of each capacitor of the sets of capacitors (e.g., capacitors 450, 475) can be the same or similar (e.g., using the same processes for each corresponding layer in the different sets). In another embodiment, the fabrication of each capacitor of the sets of capacitors can be different (e.g., using a different process for a corresponding layer in a different set such as using different annealing or deposition temperatures in different ones of the stacked capacitors 450, 475). The use of different processes to fabricate corresponding layers in different sets of capacitors can be based on various factors including desired properties of the different stacked capacitors (e.g., capacitors 450, 475).

Figure 5:
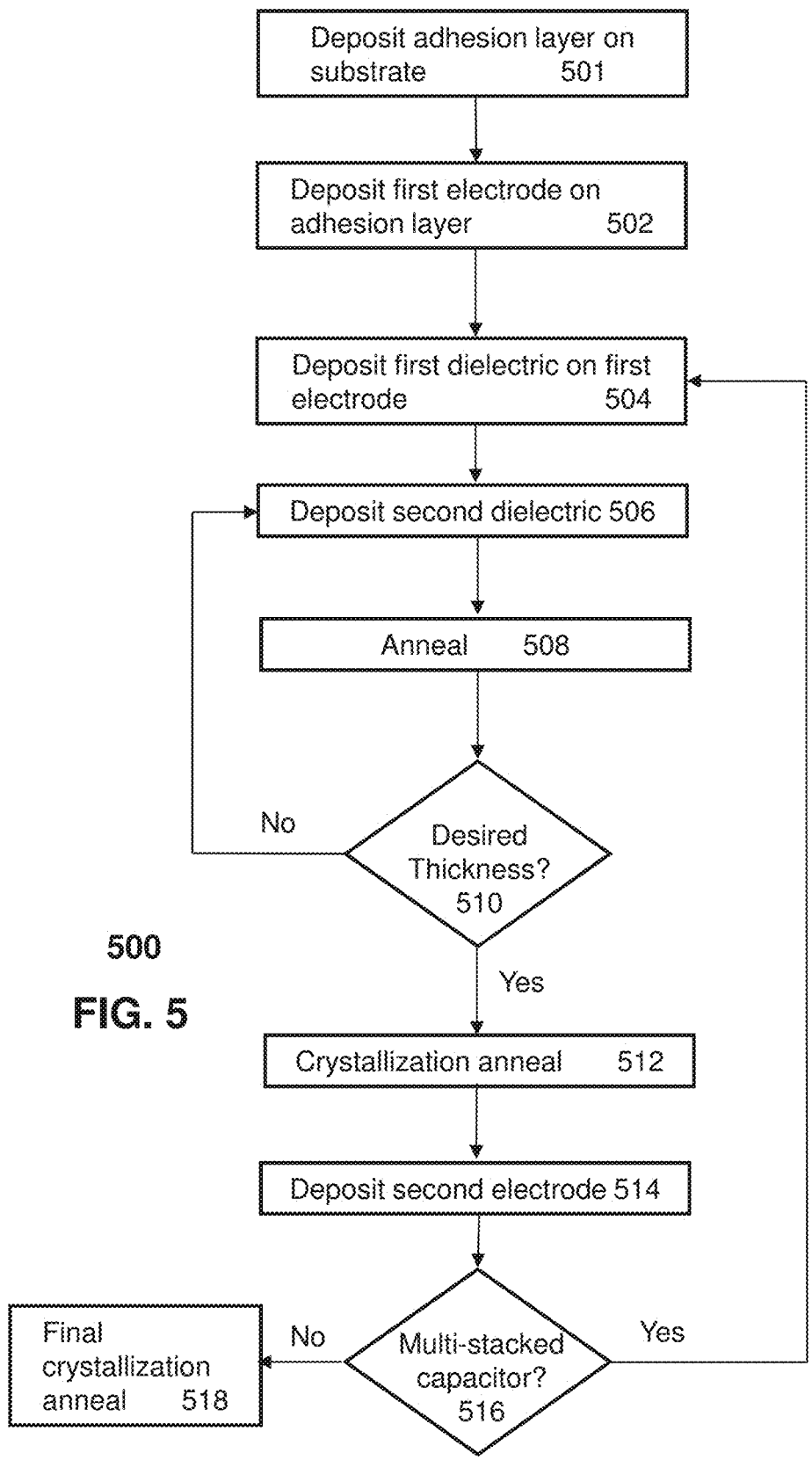
FIG. 5 illustrates an exemplary embodiment of a method of fabricating a thin film capacitor.

FIG. 5 depicts an illustrative method 500 for fabricating a multilayer capacitor structure. At 501, an adhesion layer can be deposited on a silicon dioxide layer of a silicon substrate. The adhesion layer can be or can otherwise comprise a polar dielectric. In one embodiment, the adhesion layer is not any thin film of Ti, Ta, TiOx and TaOx. In one embodiment, the adhesion layer can be multiple adhesion layers deposited on each other, such as a first adhesion layer that is or otherwise comprises a polar dielectric and a second adhesion layer that is a thin film of Ti, Ta, TiOx and TaOx, where the second adhesion layer is deposited on the first adhesion layer, and where the first adhesion layer is deposited on the SiO$_2$ layer of the silicon substrate.

At 502, a first electrode layer of conductive material may be deposited or otherwise formed on the adhesion layer. At 504, a first dielectric layer of ferroelectric material can be deposited or otherwise formed on the first electrode layer. In one embodiment, the first dielectric layer can be deposited directly onto the first electrode layer. In another embodiment, the first dielectric layer can be deposited so as to cover an entire top surface of the first electrode layer. The first dielectric layer can be formed of various materials including BST, SBT, BZN, PZT, PLZT, any other perovskite or pyrochlore phase ferroelectric film, or a combination thereof.

In one or more embodiments, the first dielectric layer can have a thickness between 50 A and 500 A. However, other thicknesses can be utilized for the first dielectric layer, such as based on the type of dielectric material, the parameters for the capacitor being formed, and so forth. In one embodiment, the thickness of the first dielectric layer can be selected so that it is thin enough to not adversely affect the operation of the capacitor but thick enough to enable suppression of hillock formation and/or avoid or reduce charge trapping.

The first dielectric layer can be a layer that suppresses formation of hillocks along the surface of the first electrode layer. As an example, the first dielectric layer can be deposited at a temperature which is low enough to prevent or reduce hillock formation. In one embodiment, a hillock temperature can be determined for the first electrode layer where the hillock temperature corresponds to the temperature above which hillock formation is likely (e.g., has been observed during testing). In this embodiment, the deposition temperature for the first dielectric layer can then be chosen to be below the hillock temperature. In one embodiment, the temperature for deposition of the first dielectric layer can be a range of temperatures, such as starting at a low temperature and raising the temperature during the deposition process for the first dielectric layer.

In one embodiment, the first dielectric layer can be deposited using a process that enables a columnar-oriented grain structure to be formed, such as via a sputtering process. In another embodiment for depositing the first dielectric layer, a sputtering process can be performed below the hillock temperature thereby preventing or reducing hillock formation while also reducing grain growth, as compared to a high-temperature sputtering process. In one embodiment, the first dielectric layer can heal and planarize possible defects and roughness in the first electrode layer when applied directly to the first electrode layer.

In one or more embodiments, the first dielectric layer can be a thin high density dielectric buffer layer, which is sputter-deposited on the electrode layer at a temperature at least 20 degrees lower than a stress relief temperature of the electrode layer, where the first dielectric layer has a grain structure that is columnar.

At 506, a second dielectric layer of ferroelectric material can be deposited or otherwise formed on the first dielectric layer. In one embodiment, the second dielectric layer can be deposited directly onto the first dielectric layer. In another embodiment, the second dielectric layer can be deposited so as to cover an entire top surface of the first dielectric layer. The second dielectric layer can be formed of various materials including BST, SBT, BZN, PZT, PLZT, any other perovskite or pyrochlore phase ferroelectric film or a combination thereof.

In one or more embodiments the second dielectric layer has a randomly oriented grain structure and is deposited on the first dielectric layer by MOD or sol-gel deposition, such as spin-deposition or misted deposition. The composition of the second dielectric layers can be the same or different than the first dielectric layer in order to improve or optimize RF and DC properties of the fabricated capacitor.

In one or more embodiments at 508, densification of the second dielectric layers can be performed by an annealing process. For example, the annealing can be performed in $O_2$ or an $O_2$/Carrier gas mixture. In one or more embodiments, this annealing can be at a temperature higher than the deposition temperature of the first dielectric layer. In another embodiment, this annealing can be at a temperature higher that is lower than a final crystallization temperature of the fabricated capacitor.

At 510, the deposition and annealing of the second dielectric layer of tunable high-K dielectric can be repeated until a desired dielectric stack thickness is achieved. In one embodiment, the composition of each layer of second dielectric layer can be the same. In another embodiment, one or more layers of the second dielectric layers can have a different composition than one or more other layers of the second dielectric layers. Various configurations of the same or different materials for the group of dielectric layers can be used, such as alternating layers of different compositions, top and bottom of the group of second dielectric layers having the same composition, gradually adjusting an amount of doping in each adjacent ones of the group of second dielectric layers, and so forth.

The use of the same materials or different materials for the group of dielectric layers can be selected to achieve improved, optimal or selected RF and DC properties. In one or more embodiments, the different compositions can be deposited on a single spin track by having multiple dispense pumps. After the annealing, the resulting dielectric stack can be amorphous and about 70% densified. Final density can be achieved after a final crystallization of the dielectric/electrode stack.

The group of second dielectric layers can have an overall thickness between 500 A and 50000 A. However, other overall thicknesses can be utilized for the second dielectric layers, such as based on the type of dielectric material, the parameters for the capacitor being formed, and so forth. In one embodiment, the thickness of the second dielectric layers can be selected so that they are thin enough to not adversely affect the operation of the capacitor but thick enough to enable suppression of dendrite formation and/or improvement of the time-dependent dielectric breakdown of the capacitor. In one or more embodiments, the second dielectric layers can have the same or different thicknesses. For example where there are three second dielectric layers, a top and bottom second dielectric layer can have the same thickness which is different from the thickness of a middle second dielectric layer.

The second dielectric layers can be layers with randomly oriented grains providing tuning interrupting the vertically oriented grain boundaries of the first dielectric layer of the capacitor resulting in an improvement in the time-dependent dielectric breakdown behavior of the capacitor. As an example, the second dielectric layer can be deposited utilizing a process that forms a randomly-oriented grain structure in the second dielectric layer. For instance, the second dielectric layers can be deposited utilizing a MOD or sol-gel process, such as spin-on deposition or misted deposition. In one embodiment, the deposition of the second dielectric layer can be performed at a low temperature, such as room temperature. In another embodiment, the second dielectric layer can be deposited using room temperature spin-coating deposition process of amorphous film with a following high temperature crystallization anneal.

In one embodiment, densification thermal processing can be applied after the deposition of the second dielectric layer, such as hot plate bakes, oven bakes, and/or vacuum oven bakes. After the initial bake the dielectric film remains amorphous with 50-70% increase in film density.

The following crystallization anneal could be an atmospheric furnace anneal, a furnace anneal in reactive ambients, a rapid thermal process, or a vacuum anneal. The temperature profile of the high temperature crystallization film should be adjusted to achieve full crystallization of the film that was amorphous as-deposited. In one embodiment, the second dielectric layer can be deposited using other processes that enable a randomly-oriented grain structure to be formed. The other process could be the misted deposition or LPCVD.

At 512, when the overall desired thickness of the second dielectric layers is achieved, a first crystallization anneal can be performed. In one or more embodiments, the first crystallization anneal can be performed at a temperature of 50-100 C lower than a final crystallization anneal. In one or more embodiments, the grain structure of the second dielectric layers of the capacitor stack after this first crystallization anneal can be microcrystalline and can have the same phase volume as in the previous step. In one embodiment, the thin film at this stage has 90% of its final density. In one or more embodiments, the spin and anneal processes and equipment can be low-cost high-throughput processes that provide a reduced or minimum cost for the fabricated capacitor. For example, a conventional furnace tube will take a load of 50 to 250 wafers for a single anneal step, allowing multiple batches to be processed a the same time.

At 514, a top electrode of conductive material can be deposited on the dielectric stack. For example, the second electrode layer of conductive material may be deposited or otherwise formed on the second dielectric layer. For example, the second electrode layer may be deposited directly onto the second dielectric layer. The second electrode layer can be formed of various materials including platinum, platinum alloy, iridium either solely or in combination with iridium oxide, ruthenium oxide, or SRO, any metal or conductive oxide, or any combination of these materials.

At 516, the preceding steps 504-514 can be repeated one or more times to achieve a multi-layer capacitor (MLC). Other processing can be applied to the capacitor structure, such as mesa patterning and etching. Patterning the capacitor layers into a mesa structure can provide access to all electrode layers and capacitor layers for later interconnection.

At 518, a final crystallization annealing can be performed, such as in an $O_2$ or $O_2$/carrier gas mixture. In one or more embodiments, the temperature of the final crystallization annealing can be the highest temperature in method 500 and can be selected to finalize RF and DC properties of the capacitor structure. At this stage, the dielectric stack can be fully densified. In one or more embodiments, the dielectric film of dielectric layers resulting from method 500 can have randomly oriented grains with cubic symmetry. The homogeneity of the solution and static forces can result in symmetric para-electric phases that increase the tunability of the capacitor device relative to the vertical columnar structure of sputter-deposited film.

In one embodiment, the first and second dielectric layers can utilize a combination of an undoped BST and a doped BST formulation, or a combination of different ferroelectric materials to facilitate reducing space charge effects and/or improving a temperature dependence of the dielectric properties of the capacitor.

In one embodiment where the first electrode layer is platinum, the hillock temperature for the platinum electrode layer can be selected to be 600 C and the first dielectric layer can be sputtered at a first temperature at or below 600 C. Other temperatures can be selected (including a temperature range or temperature ramp) so as to reduce or eliminate hillock formation depending on the type of materials being utilized and the deposition processes being employed. In one embodiment, the grain sizes of the first dielectric layer can be smaller than the grain sizes of the second dielectric layer(s), such as an average grain size of the first dielectric layer being smaller than an average grain size of the second dielectric layer(s).

In one embodiment, a planarizing and/or insulating layer can be deposited on top of the previously deposited layers, such as over the second electrode layer 118 or over the second dielectric layer. The planarizing and/or insulating layer can be etched to form a set of pathways or vias in the capacitor structure. These etched vias can provide conduits for metal interconnection materials to be deposited.

In one embodiment, such as following deposition and etching of the planarizing and/or insulating layer if such layer(s) are deposited, one or more metal interconnect layers can be deposited. The metal interconnect layer(s) can create electrical connections for the thin film capacitor.

In one embodiment, the electrodes can be patterned electrodes and the first and second dielectric layers can be formed on the patterned electrodes. For example, the electrode layer can only partially cover the substrate due to patterning of the electrode layer on the substrate. In one embodiment, the dielectric layer can completely cover the patterned electrode layer.

In one embodiment following deposition of the metal interconnect layer, an additional layer of protective material, such as a silicon nitride overcoat, may be deposited on top of the metal interconnect layer and/or gold humps may be attached to the metal connections to help protect the previously deposited structures. Other steps can be performed to provide desired connections for one or more of the various layers or elements of the structure as described herein to allow for the intended function of the structure, such as a voltage tunable capacitor.

Figure 6:
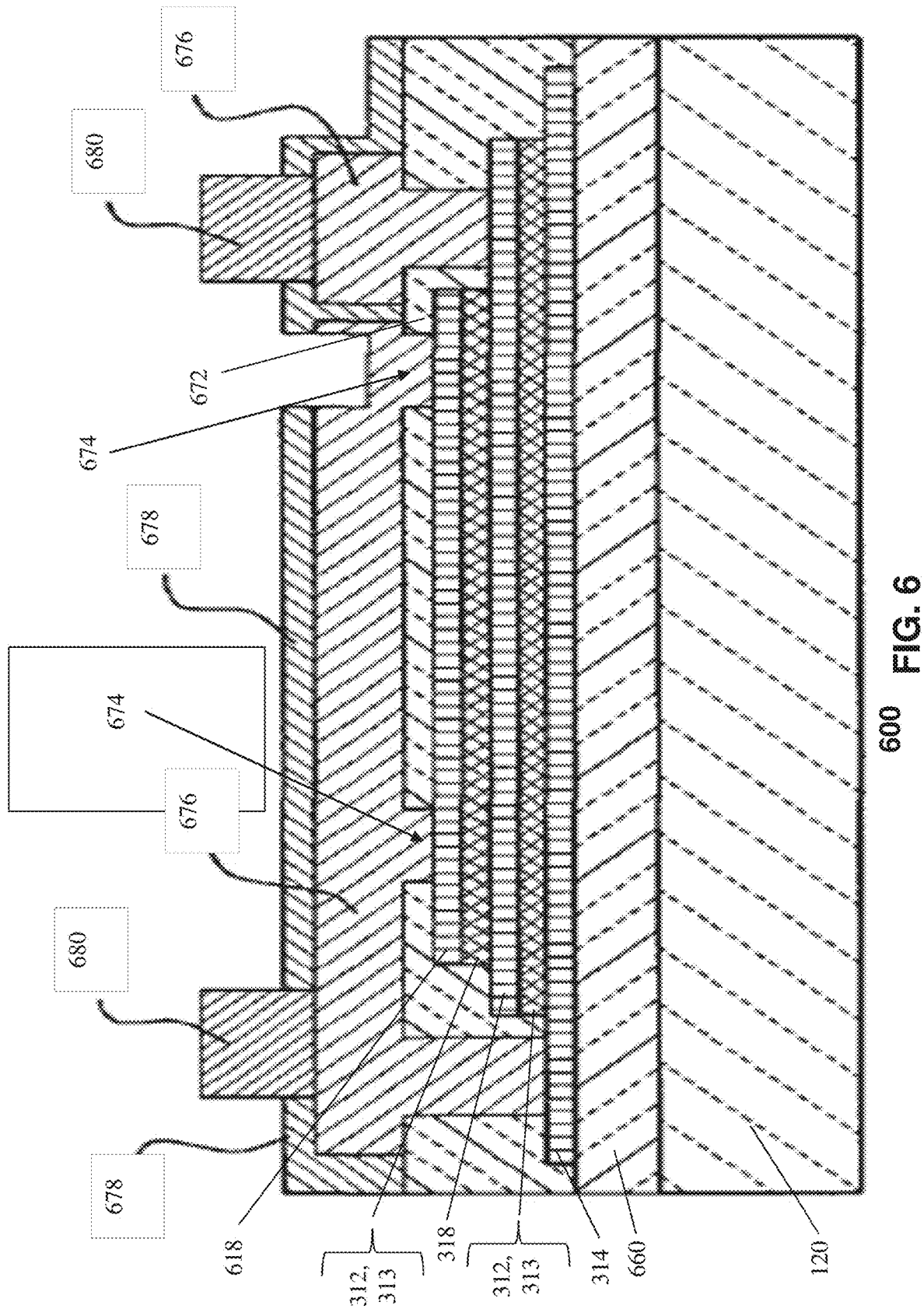
FIG. 6 illustrates another exemplary embodiment of a thin film capacitor having multiple dielectric layers.

FIG. 6 depicts a structure 600 that includes two sets of stacked dielectric layers, which in this example are dielectric layers 312, 313, and which utilizes a polar dielectric adhesion layer. Any number of sets of stacked dielectric layers 312, 313 can be utilized and various other connections can be implemented. In one embodiment, the dielectric layer 313 is a group of dielectric layers (e.g., formed according to method 500 and that have a random-oriented grain structure) deposited directly on dielectric layer 312 having columnar-oriented grains structures. The deposition process for the dielectric layer 312 and the dielectric layers 313 can be different, such as depositing the dielectric layer 312 at a low temperature which is below the temperature at which hillock formation occurs and depositing the dielectric layer 313 at a high temperature. The stacked capacitors in FIG. 6 can share a middle electrode 318.

In one embodiment, an adhesion layer 660 comprising a polar dielectric is deposited on the silicon dioxide layer of the substrate 320. The sets of dielectric layers 312, 313 and the electrode layers 314, 318, 618 are patterned to form a mesa structure, to facilitate providing an electrical connection to each electrode layer.

In one embodiment, a planarizing and insulating layer 672 (e.g., an ILD glass layer) can be deposited, patterned and etched to form vias 674. A metal interconnect layer 676 can be deposited over the planarizing and insulating layer 672 and into the vias 674 to provide an electrical connection to the electrodes 314, 318, 618. In one embodiment, a nitride overcoat 678 can be deposited to protect the metal interconnect layer 676 and gold bumps 680 can be deposited to provide electrical contacts for final packaging.

Figure 7A:
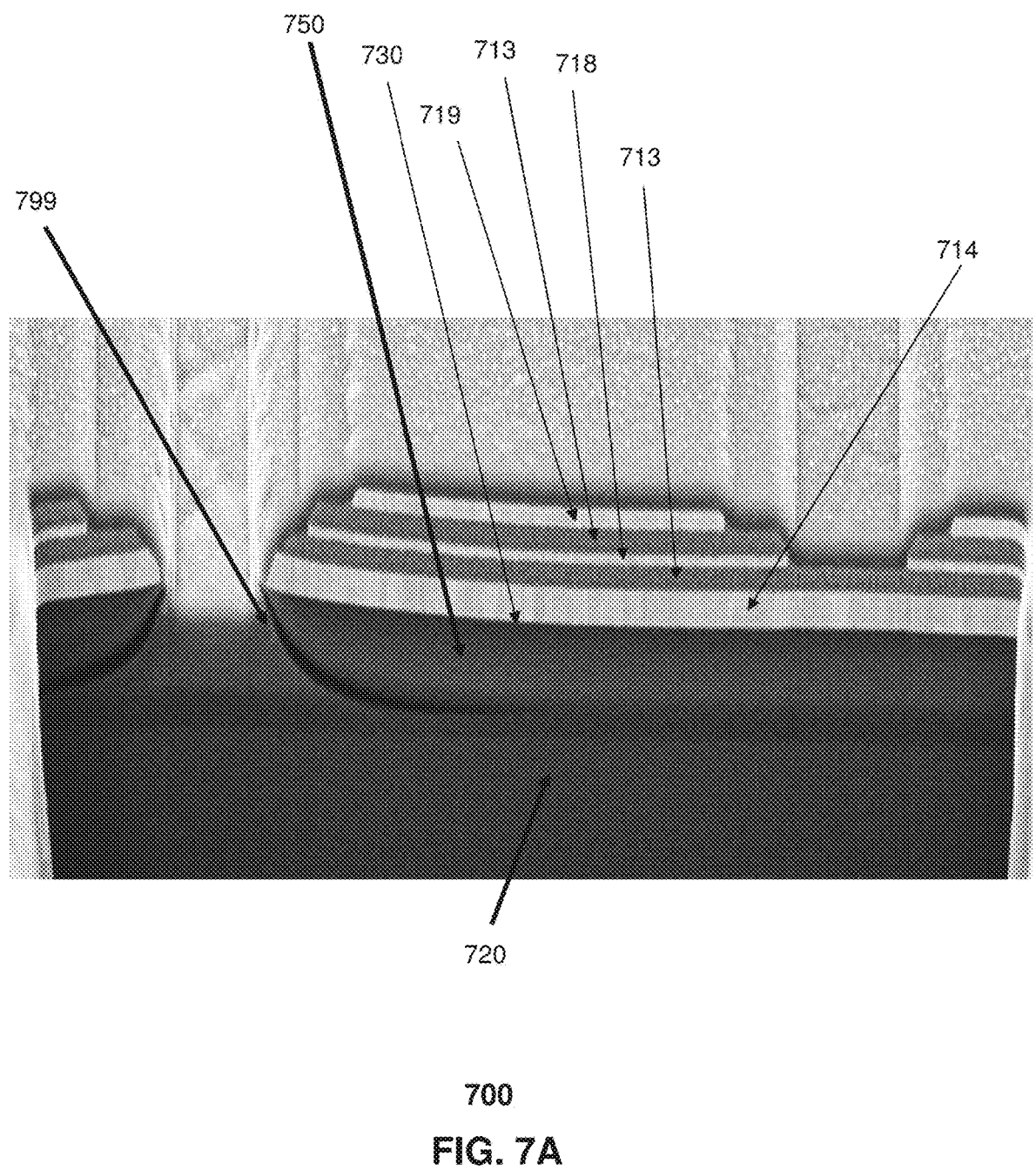
FIGS. 7A and 7B illustrate focused ion beam cross-section images of tunable devices.

Referring to FIG. 7A, a focused ion beam image of a portion of a device 700 is shown. Device 700 is a stacked dielectric device that includes electrode layers 714, 718, 719, dielectric layers 713, a silicon substrate 720, an adhesion layer 730, and a field oxide 750 which is an $SiO_2$ layer. The dielectric layers 713 are BST. The electrode layers 714, 718, 719 are platinum.

The adhesion layer 730 is a thin layer, such as about 200 Å thick. The adhesion layer 730 is deposited as a single layer of BST (e.g., a polar dielectric adhesion layer). The adhesion layer 730 due to the configuration of the adhesion layer on the $SiO_2$ and platinum electrode will include TiOx in the dielectric.

A field oxide crack and delamination 799 is illustrated. The image of FIG. 7A is showing that the delamination of tunable devices on the Si substrate is starting from the crack in the initial oxide (i.e., the $SiO_2$ layer 750). There is no evident delamination between the $SiO_2$ layer 750, the adhesion layer 730, and the electrode 714. The adhesion layer 730 is appropriately adhering to both the $SiO_2$ and the Pt of layers 750, 714. If the adhesion layer 730 were not sufficient, the stack stress would be relieved by delamination of the adhesion layer from the $SiO_2$ layer 750 or the Pt layer 714 from the adhesion layer and there would be no SiO$_2$ cracking. FIG. 7A illustrates the crack in SiO$_2$ 750 which is the layer with the lowest TEC carrying all the stack stress.

Figure 7B:
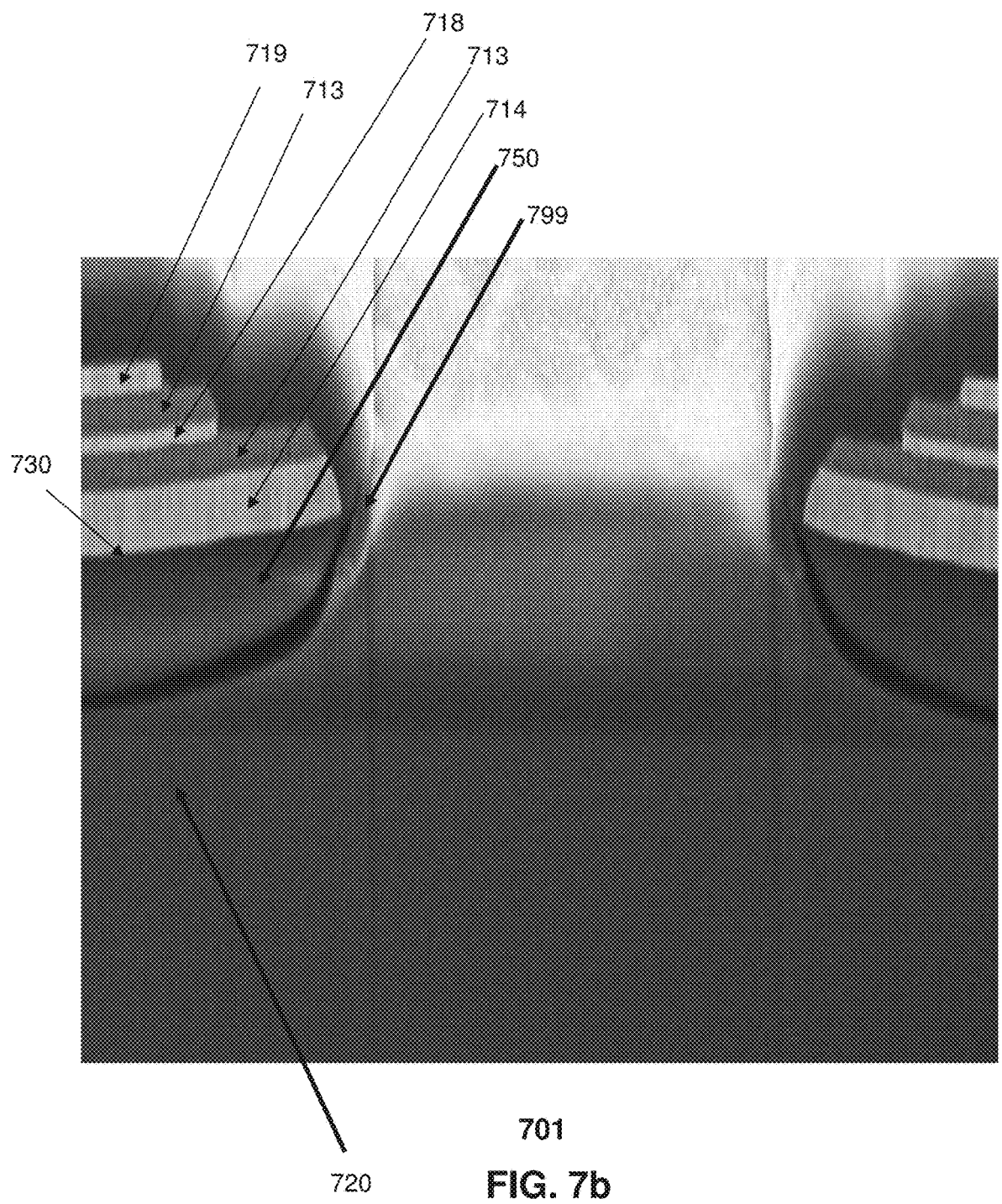

Referring to FIG. 7B, a focused ion beam image of a portion of a device 701 is shown. Device 701 is a stacked dielectric device that includes electrode layers 714, 718, 719, dielectric layers 713, a silicon substrate 720, an adhesion layer 730, and a field oxide 750 which is an SiO$_2$ layer. The dielectric layers 713 are BST. The electrode layers 714, 718, 719 are platinum.

The adhesion layer 730 is a thin layer, such as about 200 Å thick. The adhesion layer 730 is deposited as a single layer of BST (e.g., a polar dielectric adhesion layer). The adhesion layer 730 due to the configuration of the adhesion layer on the SiO$_2$ and platinum electrode will include TiOx in the dielectric. A field oxide crack and delamination 799 is illustrated. The image of FIG. 7B is showing that the delamination of tunable devices on the Si substrate is starling from the crack in the initial oxide (i.e., the SiO$_2$ layer 750). There is no evident delamination between the SiO$_2$ layer 750, the adhesion layer 730, and the electrode 714. The adhesion layer 750 is appropriately adhering to both the SiO$_2$ and the Pt of layers 750, 714.

In one or more embodiments, the adhesion layer described herein can be used in conjunction with an annealed multilayer initial oxide that provides poly-silicates. The exemplary embodiments described herein can be used with or otherwise can include one or more features (e.g., in addition to and/or in place of feature(s) of the exemplary embodiments) described in U.S. application Ser. No. 15/901, 468 entitled "METHOD AND APPARATUS FOR COMPENSATING FOR HIGH THERMAL EXPANSION COEFFICIENT MISMATCH OF A STACKED DEVICE" filed contemporaneously herewith, the disclosure of all of which is hereby incorporated by reference herein.

In one or more embodiments, various techniques and elements (including techniques and elements after the providing of the adhesion layer) can be used to form one or more of the elements of the device. The exemplary embodiments described herein can be used with or otherwise can include one or more features (e.g., in addition to and/or in place of feature(s) of the exemplary embodiments) described in U.S. application Ser. No. 15/791,177 entitled "SMALL-GAP COPLANAR TUNABLE CAPACITORS AND METHODS FOR MANUFACTURING THEREOF" filed Oct. 23, 2017, the disclosure of all of which is hereby incorporated by reference herein.

In one or more embodiments, various techniques and elements (including techniques and elements after the providing of the adhesion layer) can be used to form one or more of the elements of the device. The exemplary embodiments described herein can be used with or otherwise can include one or more features (e.g., in addition to and/or in place of feature(s) of the exemplary embodiments) described in U.S. application Ser. No. 15/791,176 entitled "TUNABLE COPLANAR CAPACITOR WITH VERTICAL TUNING AND LATERAL RF PATH AND METHODS FOR MANUFACTURING THEREOF" filed Oct. 23, 2017, the disclosure of all of which is hereby incorporated by reference herein.

Upon reviewing the aforementioned embodiments, it would be evident to an artisan with ordinary skill in the art that said embodiments can be modified, reduced, or enhanced without departing from the scope of the claims described below. For example, a second adhesion layer can be deposited over adhesion layer 600, where the second adhesion layer is different from the polar dielectric material of the first adhesion layer. As another example, an additional dielectric layer can be added to the group of dielectric layers while configuring the stacking such that at the interface with the electrodes the same or similar crystal grain structure is maintained and/or the same or similar dielectric composition exists. For instance, a stack can be formed which is configured as follows: a third dielectric layer having a columnar grain orientation deposited on the group of second dielectric layers 313 having the random grain orientation which are deposited on the first dielectric layer 312 having the columnar grain orientation. In this example, the same crystal grain structure (columnar) and the same dielectric composition (e.g., BST) exists at the top and bottom electrode interfaces. In addition it would be evident to an artisan of ordinary skill in the art that the temperature of the intermediate anneals 508 and final crystallization anneals 512 can be varied according to the final capacitor performance requirements and also can be present or absent at any step of the process 500.

In one or more embodiments, a sputtering target can be selected or fabricated (and utilized in one or more of the exemplary embodiments) according to one or more of the features or process steps of U.S. Patent Publication No. 20140216921, the disclosure of which is hereby incorporated by reference.

One or more of the exemplary embodiments provide for a deposition of a thin sputtered buffer layer (e.g., doped BST) on a conductive electrode plus the spin-deposition and anneal of one or more metal-organic (MOD) or sol-gel deposited layers. In one or more embodiments, an intermediate crystallization anneal may be performed once a final dielectric thickness is obtained and/or a final crystallization anneal may be performed after the dielectric/electrode stack has been formed. In one or more embodiments, a thin sputtered buffer layer is provided that can improve the voltage breakdown and hysteresis of the spin-deposited dielectric by several orders of magnitude relative to dielectrics spin-deposited directly on the electrode material and subsequently annealed.

One or more of the exemplary embodiments can provide a low-cost method of manufacturing by allowing the use of conventional high-throughput atmospheric diffusion tubes and MOD or sol-gel spin deposition rather than single-wafer high-temperature sputter-deposition with limited throughput and high capital cost and cost-of-ownership. In one or more embodiments, the sputter-deposition of the thin low-temperature buffer layer can be quick and can have minimal time lost for temperature ramping and thus can make better use of the high-cost sputter deposition equipment. One or more of the exemplary embodiments allows for different compositions for each layer in the dielectric stack that enables optimization, improvement, or selectivity of the RF and DC properties of the final device.

One or more of the exemplary embodiments can give a much lower cost method of fabricating high-quality tunable dielectric materials and/or can give much better flexibility in composition of the dielectric stack. Stacked dielectric layers can provide for a change in grain structures in different dielectric layers.

One or more of the exemplary embodiments can reduce or eliminate dendrite formation. In one or more embodiments, the first thin dense layer of dielectric is deposited at the temperature lower than stress relief temperature of the electrode, which can reduce or eliminate hillock formation on the electrode(s) resulting in high breakdown voltage. The systems and methods described herein provide a composite high-k thin film stack which improves the time-dependent dielectric breakdown of the thin film capacitor. Other embodiments are described by the subject disclosure.

One or more features and/or process steps described in U.S. Pat. Nos. 8,154,850, 8,693,162, 8,664,704, 5,745,335, U.S. Patent Publication No. 20140216921, and U.S. application Ser. No. 14/642,222 can be utilized in place of or in addition to one or more features and/or process steps described herein with respect to the exemplary embodiments. The disclosures of U.S. Pat. Nos. 8,154,850, 8,693,162, 8,664,704, 5,745,335, U.S. Patent Publication No. 20140216921, and U.S. application Ser. No. 14/642,222 are incorporated herein by reference in their entirety.

One or more of the thin film capacitors described with respect to the exemplary embodiments can be utilized in various components including tunable filters, voltage controlled oscillators, tunable phase shifters, tunable matching networks, low-impedance power supplies, decoupling high-frequency signals at an IC bonding pad, mobile phone components (where the mobile phone includes an antenna and a transceiver) or others. Integrated circuits including ferroelectric capacitors described with respect to the exemplary embodiments may, for example, be used in portable electronics for low-power wireless communication (e.g., cellular phones, pagers, PDAs, and so forth), directional antenna systems, high clock-rate microphones, miniature DC to DC converters, or other devices.

Other embodiments can be applied to the subject disclosure without departing from the scope of the claims described below.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A thin film capacitor comprising:
    a silicon substrate having a silicon dioxide layer;
    an adhesion layer on the silicon dioxide layer, wherein the adhesion layer is a polar dielectric material;
    a first electrode layer on the adhesion layer;
    a dielectric layer on the first electrode layer;
    a second electrode layer on the dielectric layer; and
    connections for the first electrode layer, the second electrode layer, or both.

2. The thin film capacitor of claim 1, further comprising another adhesion layer between the adhesion layer and the first electrode layer.

3. The thin film capacitor of claim 2, wherein the another adhesion layer is a thin film of Ti, Ta, TiOx or TaOx.

4. The thin film capacitor of claim 1, wherein the dielectric layer comprises:
    a first dielectric layer on the first electrode layer, wherein the first dielectric layer has a columnar-oriented grain structure; and
    a group of second dielectric layers stacked on the first dielectric layer, wherein each of the group of second dielectric layers has a randomly-oriented grain structure, wherein at least one of the group of second dielectric layers is formed from a different material from at least one other of the group of second dielectric layers.

5. The thin film capacitor of claim 1, wherein the adhesion layer is between 50 to 500 Angstroms thick.

6. A thin film capacitor comprising:
    a silicon substrate with a silicon dioxide layer;
    an adhesion layer on the silicon dioxide layer of the silicon substrate, wherein the adhesion layer comprises a polar dielectric selected from a family of niobate, zirconate, titanate, and silicate or a mixture thereof, and wherein the adhesion layer is not any thin film of Ti, Ta, TiOx and TaOx, wherein the adhesion layer is between 50 to 500 Angstroms thick;

another adhesion layer on the adhesion layer, wherein the another adhesion layer comprises a thin film, and the another adhesion layer comprising one of Ti or TiOx;

a first electrode layer on the another adhesion layer;

a dielectric layer on the first electrode layer;

a second electrode layer on the dielectric layer; and a connection for the first electrode layer, the second electrode layer, or both.

7. The thin film capacitor of claim 6, wherein the polar dielectric is selected from a family of alkali zirconate, alkali niobate, alkali silicate, alkali-earth zirconate, alkali-earth niobate, alkali-earth silicate, or a mixture thereof.

8. The thin film capacitor of claim 6, wherein the adhesion layer is amorphous.

9. The thin film capacitor of claim 6, wherein the dielectric layer comprises:
   a first dielectric layer on the first electrode layer, wherein the first dielectric layer has a columnar-oriented grain structure; and
   a second dielectric layer on the first dielectric layer, wherein the second dielectric layer has a randomly-oriented grain structure.

10. The thin film capacitor of claim 9, further comprising: a group of additional second dielectric layers formed on the second dielectric layer and on each other, and wherein the second dielectric layer and the group of additional second dielectric layers are formed from the same material.

11. The thin film capacitor of claim 9, further comprising: a group of additional second dielectric layers formed on each other, and wherein at least one of the second dielectric layer and the group of additional second dielectric layers is formed from a different material from at least one other of the second dielectric layer and the group of additional second dielectric layers.

12. The thin film capacitor of claim 9, wherein the first dielectric layer comprises a pyrochlore phase ferroelectric film.

13. The thin film capacitor of claim 9, wherein the first dielectric layer is formed from a different material from the second dielectric layer, and wherein the adhesion layer comprises barium-strontium-titanate (BST).

14. A thin film capacitor comprising:
   a silicon substrate with a silicon dioxide layer;
   a first adhesion layer on the silicon dioxide layer of the silicon substrate, wherein the first adhesion layer comprises a polar dielectric selected from a family of niobate, and silicate or a mixture thereof, wherein the first adhesion layer is not any thin film of Ti, Ta, TiOx and TaOx, wherein the first adhesion layer is polycrystalline, and wherein the first adhesion layer is between 50 to 500 Angstroms thick;
   a second adhesion layer on the first adhesion layer, wherein the second adhesion layer comprises a thin film, the second adhesion layer comprising one of Ti or TiOx;
   a first electrode layer on the second adhesion layer;
   a dielectric layer on the first electrode layer, wherein the dielectric layer comprises a first dielectric layer on the first electrode layer, and a second dielectric layer on the first dielectric layer;
   a second electrode layer on the dielectric layer; and
   a connection for the first electrode layer, the second electrode layer, or both.

15. The thin film capacitor of claim 14, wherein the second adhesion layer comprises Ti, Ta, TiOx or TaOx.

16. A thin film capacitor comprising:
   a silicon substrate with a silicon dioxide layer;
   an adhesion layer on the silicon dioxide layer of the silicon substrate, wherein the adhesion layer comprises a polar dielectric selected from a family of niobate, zirconate, titanate, and silicate or a mixture thereof, wherein the adhesion layer is not any thin film of Ti, Ta, TiOx and TaOx, wherein the adhesion layer is polycrystalline, and wherein the adhesion layer is between 50 to 500 Angstroms thick;
   another adhesion layer on the adhesion layer, the another adhesion layer comprising one of Ti or TiOx, and the another adhesion layer comprising a thin film;
   a first electrode layer on the another adhesion layer;
   a first dielectric layer on the first electrode layer, wherein the first dielectric layer has a columnar-oriented grain structure;
   a group of second dielectric layers stacked on the first dielectric layer to obtain a dielectric stack, wherein each of the group of second dielectric layers has a randomly-oriented grain structure, wherein at least one of the group of second dielectric layers is formed from a different material from at least one other of the group of second dielectric layers;
   a second electrode layer on the group of second dielectric layers, wherein the dielectric stack extends between the first electrode layer and the second electrode layer;
   a connection for the first electrode layer, the second electrode layer, or both.

17. The thin film capacitor of claim 16, wherein the polar dielectric is selected from a family of alkali zirconate, alkali niobate, alkali silicate, alkali-earth zirconate, alkali-earth niobate, and alkali-earth silicate, or a mixture thereof.

18. The thin film capacitor of claim 6, wherein the adhesion layer is polycrystalline.

* * * * *